United States Patent
Sandhu

Patent Number: 5,153,465
Date of Patent: Oct. 6, 1992

[54] DIFFERENTIAL, HIGH-SPEED, LOW POWER ECL-TO-CMOS TRANSLATOR

[75] Inventor: Bal Sandhu, Fremont, Calif.

[73] Assignee: National Semiconductor Corporation, Santa Clara, Calif.

[21] Appl. No.: 741,105

[22] Filed: Aug. 6, 1991

[51] Int. Cl.[5] ........................ H03K 19/0175
[52] U.S. Cl. ........................ 307/475; 307/296.8; 307/443
[58] Field of Search ............ 307/475, 443, 310, 451, 307/296.8

[56] References Cited

U.S. PATENT DOCUMENTS

| | | | |
|---|---|---|---|
| 4,841,175 | 6/1989 | De Man et al. | 307/475 |
| 4,939,393 | 7/1990 | Petty | 307/475 |
| 5,012,137 | 4/1991 | Muellner | 307/443 |
| 5,019,726 | 5/1991 | Guo | 307/443 |

Primary Examiner—Edward P. Westin
Assistant Examiner—Benjamin D. Driscoll
Attorney, Agent, or Firm—Limbach & Limbach

[57] ABSTRACT

A high-speed lower power differential ECL to CMOS translator that includes a translator stage that converts differential ECL level input signals to intermediate CMOS level signals, a gain stage that converts the intermediate CMOS level signals to full CMOS level output signals and temperature independent reference circuitry connected to the translator stage for compensating for process variations that might otherwise effect the performance of the translator stage.

5 Claims, 4 Drawing Sheets

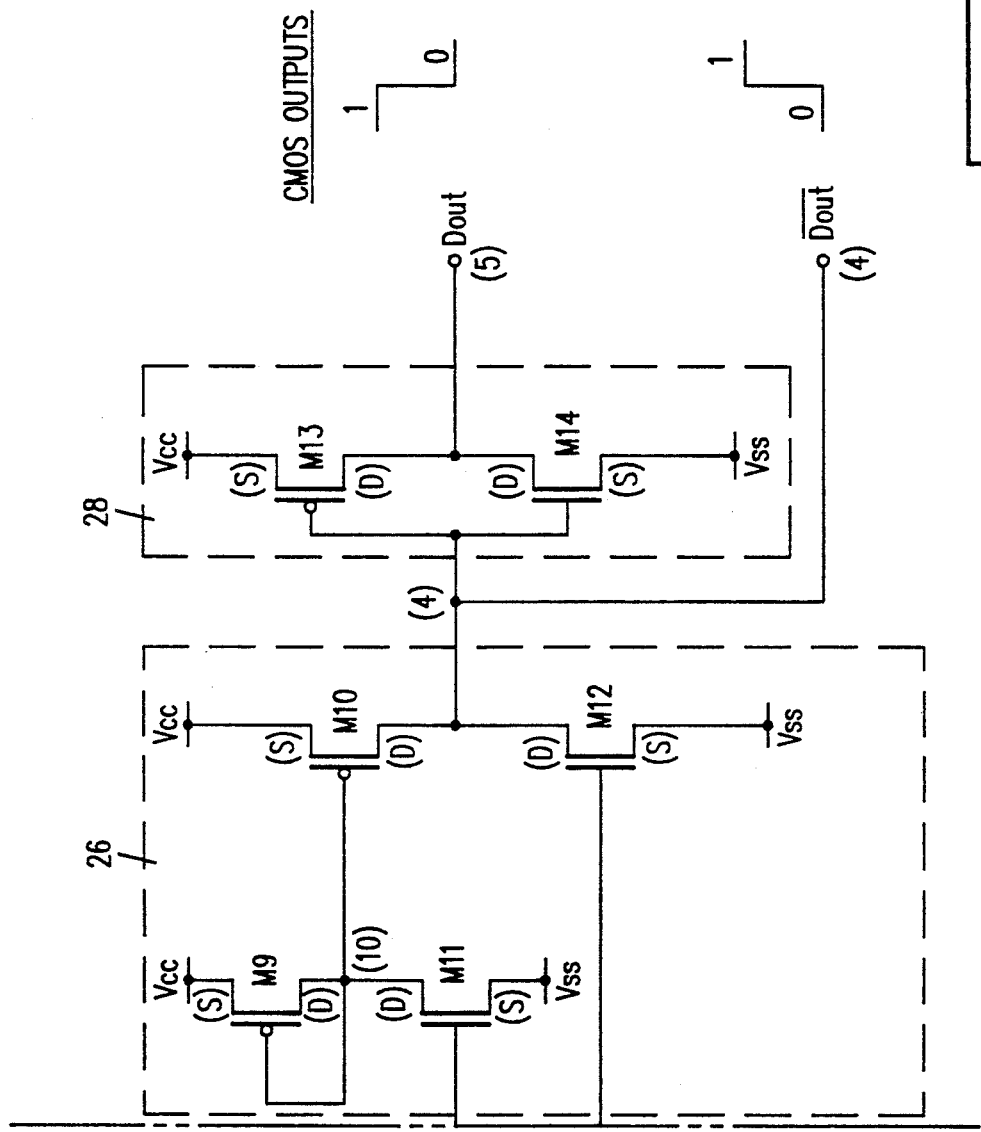
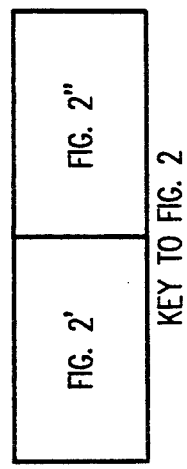
PRIOR ART
FIG. 2"

DIFFERENTIAL, HIGH-SPEED, LOW POWER ECL-TO-CMOS TRANSLATOR

BACKGROUND OF THE INVENTION

1. Field of the Invention

The present invention relates to an emitter coupled logic (ECL) to complementary metal oxide semiconductor (CMOS) translator, and more particularly, to an improved high speed, low power ECL-to-CMOS translator which is impervious to changes power supply, operating temperature and process variations.

2. Description of the Prior Art

With the introduction of BiCMOS technology, which combines the advantages of both bipolar and CMOS technologies on a single semiconductor integrated circuit (IC), ECL-to-CMOS translators are required to translate signals from ECL logic levels to CMOS logic levels.

FIG. 1 shows a block diagram of a conventional ECL-to-CMOS translator 10. The ECL-to-CMOS translator 10 includes a first node (1) coupled to Vss (ground), a second node (2) coupled to receive an ECL input signal [Din] from an ECL circuit 12, a third node (3) coupled to receive a complementary ECL input signal Din from the ECL circuit 12, a fourth node (4) coupled to provide a CMOS output signal [Dout] to a CMOS circuit 14, and a fifth node (5) coupled to provide a complementary CMOS output signal Dout to the CMOS circuit 14.

During operation, the ECL-to-CMOS translator 10 converts the complementary ECL input signals received at nodes (2) and (3) to complementary CMOS output signals provided at nodes (4) and (5), respectively.

ECL circuits typically operate between a five volt differential and have a logic swing ranging from 0.7 volts below the upper potential to 2.0 volts above the lower potential. For example, if the voltage differential is set at a low of −5.0 volts (Vee) to a high of 0.0 volts, then a signal having a potential ranging from −0.7 volts to 0.0 volts is a logical high ("1") and a signal having a potential ranging from −3.0 volts to −5.0 volts is a logical low ("0").

CMOS circuits typically operate between a five volt differential and have a 2 volt logic swing ranging from 1.5 volts below the upper potential to 1.5 volts above the lower potential. For example, if the voltage differential is set at a low of 0.0 volts to a high of 5.0 volts, then a signal having a potential from 3.5 to 5.0 volts is a logical high ("1") and a signal having a potential ranging from 0.0 to 1.5 volts is a logical low ("0").

FIG. 2 shows a prior art circuit implementation of an ECL-to-CMOS 20 translator that is consistent with the FIG. 1 block diagram. In general, the circuit 20 includes a first stage level shifter 22, a second stage level shifter 24, a current gain stage 26 and a basic CMOS invertor 28.

The first stage level shifter 22 translates the ECL level signal [Din] at node (2) into an intermediate CMOS level signal at node (6) through the operation of input transistor M1, M2 and M3. As input signal Din switches from high to low, the potential applied to the gate of transistor M3 is reduced, thereby decreasing the conductance of transistor M3. As a result, the potential at node (7) is pulled down. Transistor M5 acts like a capacitor, storing charge at node (7). As input signal Din switches from high to low, the charge on the gate of transistor M5 is reduced, thereby decreasing the potential at the gate of transistor M5. Thus, transistors M3 and M5 complement one another to pull down node (7). Transistor M6 acts as a resistor at node (8) coupled to the gate of transistor M4. The resistance at node (8) tends to control the conductance of transistor M4, thereby controlling how far node (7) is pulled down.

Conversely, as input signal [Din] switches from low to a high state, a higher potential is applied to the gate of input transistor M1. As a result, transistor M1 is turned on hard. The greater conductance of transistor M1 tends to pull up node (6). Because node (7) is simultaneously pulled down, the potential at the gate of transistor M2 is reduced. As a result, transistor M2 assists transistor M1 in pulling up node (6) to an intermediate CMOS signal level.

Gain stage 26 translates the intermediate CMOS level potentials at nodes (6) and (9) to full CMOS logic levels. With node (6) pulled up to the first intermediate CMOS potential, an increased potential is applied to the gate of N-channel transistor M11, the drain of which is coupled to the gate of P-channel transistor M9. As a result, transistor M11 turns on hard, thereby pulling node (10) down to Vss. With node (10) pulled down, P-channel transistor M10 is turned on hard. With node (6) coupled to the gate of transistor M8, and with node (6) being pulled up to an intermediate CMOS level, the potential at node (9) falls towards Vss. Transistors M10 and M12 cooperate with one another to pull up output signal [Dout] at node (4) to its full CMOS logic level.

CMOS invertor 28 receives the full CMOS logic level signal at node (4) and inverts it at node (5) to provide complementary signal Dout, thus completing the ECL to CMOS translation.

Alternatively, in the event that the ECL input signals [Din] and Din switch from high to low and low to high respectively, transistors M1 through M14 operate in the complement of one another. As a result signal [Dout] is pulled down and signal Dout is pulled up.

The prior art ECL-to-CMOS translator 20 described above has a number of deficiencies. First, during DC operation, an intermediate voltage is constantly being applied to the gates of transistors M1-M12. As a result, transistors M1-M12 are always on, conducting current and dissipating power. During non-switching operation of the ECL-to-CMOS translator 20, approximately 5-10 mA of current is dissipated, depending on the output state.

Another problem occurs during the AC switching operation of the ECL to CMOS translator 20. During a switching operation, all of transistors M1-M14 are in transition from one state to another. Accordingly, each of the transistors M1-M14 consumes more current than when in the non-switching state. During switching, the ECL-to-CMOS translator 20 dissipates approximately 21 mA of current.

Yet another problem of the ECL-to-CMOS translator 20 is that its fourteen transistors M1-M14 require a period of time to complete the switching operation, which is too slow for many BiCMOS product applications.

Finally, with fourteen transistors, the ECL-to-CMOS circuit 20 is impractical for modern high density BiCMOS products. For example in a 1 Meg BiCMOS SRAM, there are at least twenty ECL to CMOS transistors that would consume, worse case, 10 mA*20=200 mA DC power just for the inputs. Also, it would create space and layout problems and reduce product yields, all of which would render the manufacture of such a device economically unfeasible.

SUMMARY OF THE INVENTION

The present invention provides a differential, high-speed, low power ECL-to-CMOS translator circuit that includes a translator stage that converts differential ECL level input signals to intermediate CMOS level signals, a gain stage that converts the intermediate CMOS level signals to a full CMOS level output, and temperature independent reference circuitry connected to the translator stage to compensate for process variations that might otherwise effect the performance of the translator stage.

An optional buffer can be added to receive the full CMOS output to drive additional load.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
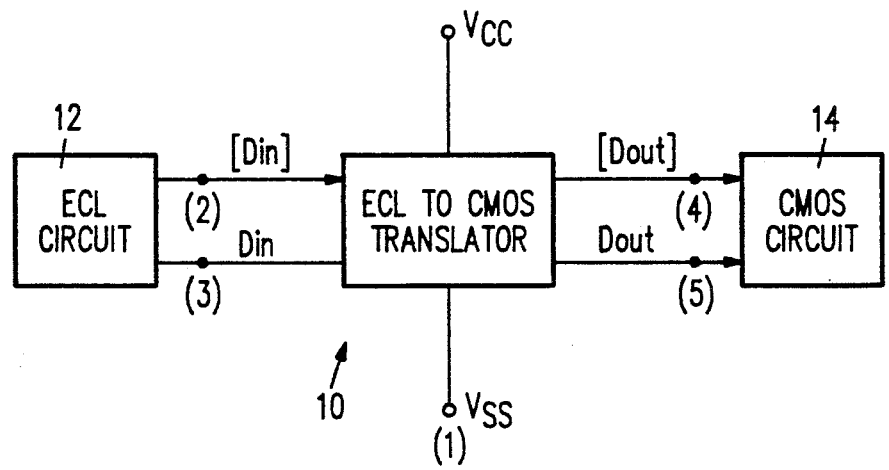
FIG. 1 is block diagram illustrating a conventional ECL-to-CMOS translator.
Figure 3:
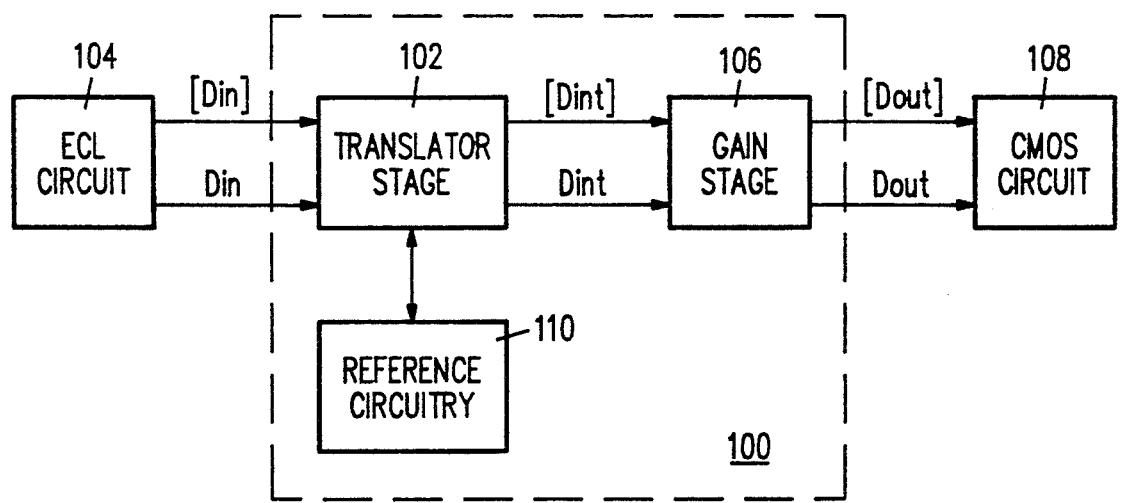
FIG. 3 is a block diagram illustrating an ECL-to-CMOS translator in accordance with the present invention.
Figure 2:
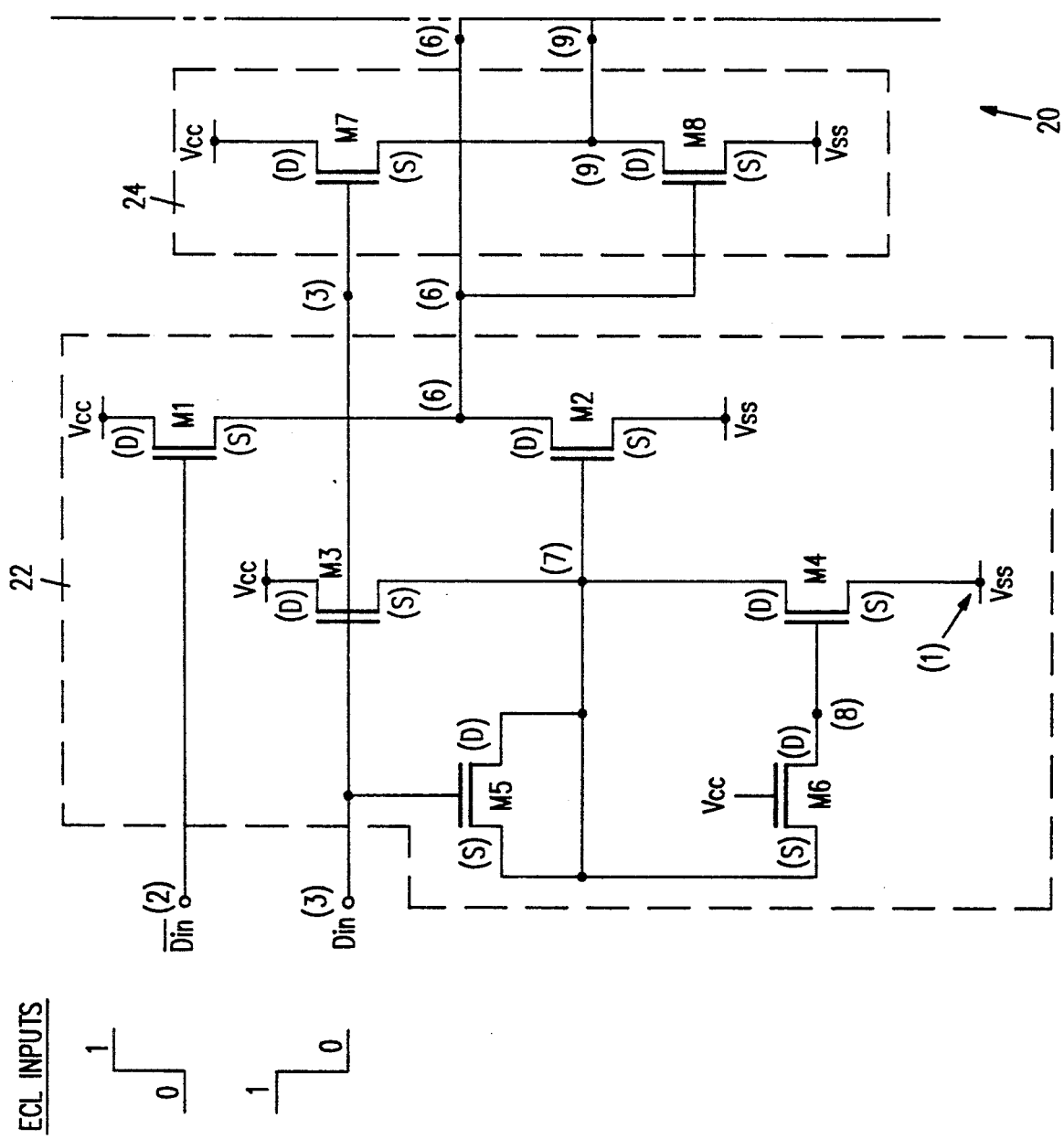
FIG. 2 is a schematic diagram illustrating a conventional ECL-to-CMOS translator circuit.

FIG. 3 shows a block diagram of an ECL-to-CMOS translator circuit 100. As described in greater detail below, the ECL-to-CMOS translator circuit 100 includes a translator stage 102 that converts differential ECL level input signals Din and [Din] received from an ECL circuit 104 to intermediate CMOS level signals Dint and [Dint]. A gain stage 106 then converts the intermediate CMOS level signals Dint and [Dint] to full CMOS level signals Dout and [Dout] which are utilized by CMOS circuit 108. Temperature independent reference circuitry 110 connected to the translator stage 102 compensates for any process variations that might otherwise effect the elements comprising translator stage 102.

Figure 4:
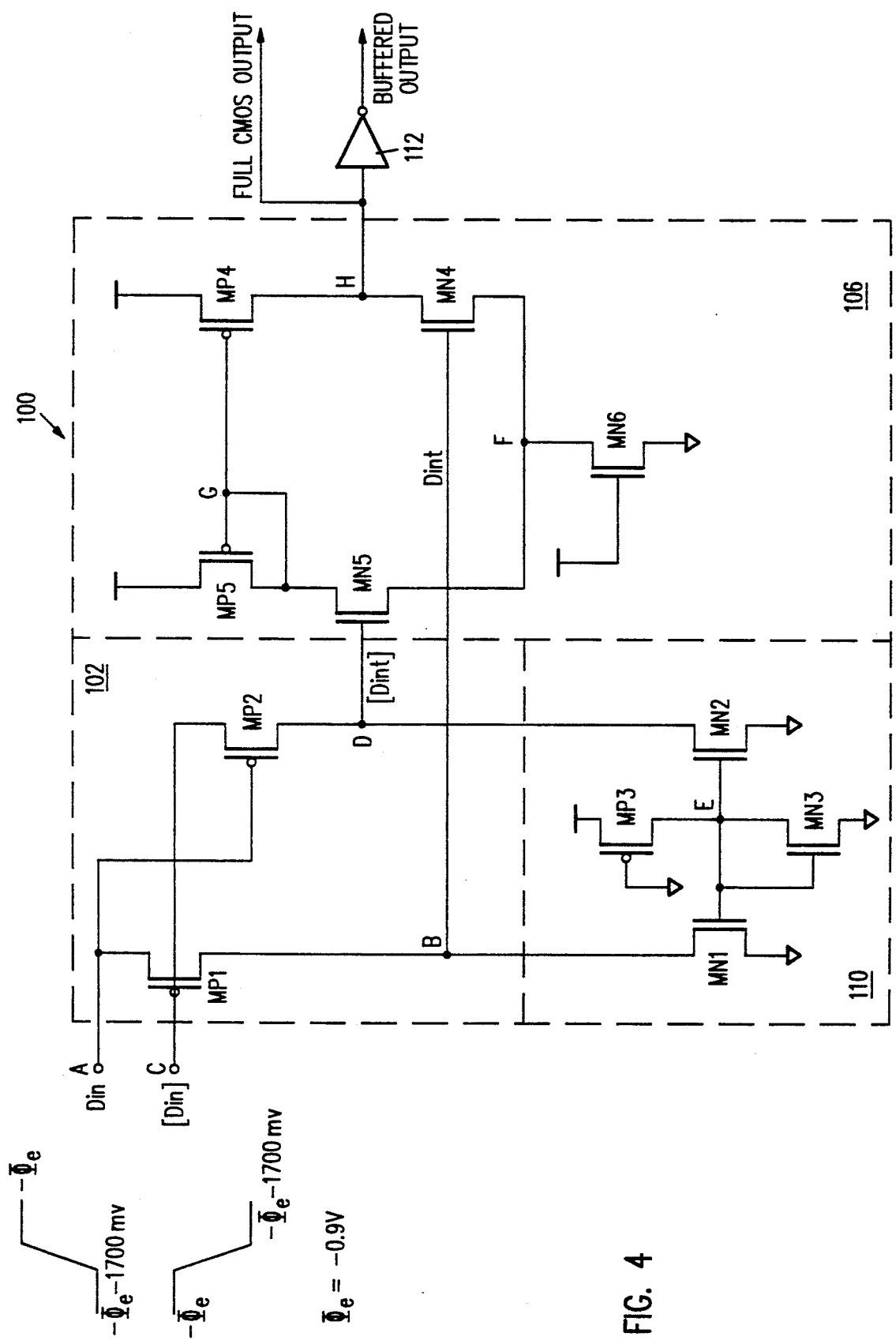
FIG. 4 is a schematic diagram illustrating a circuit embodiment of an ECL to CMOS translator in accordance with the present invention.

FIG. 4 shows a circuit embodiment of the ECL-to-CMOS translator 100.

In the FIG. 4 embodiment, the translator stage 102 of the ECL-to-CMOS translator 100 includes two P-channel transistors MP1 and MP2. Transistor MP1 has its source connected to input node A, its drain connected to node B and its gate connected to node C to receive ECL level input signal [Din]. Transistor MP2 has its source connected to node C, its drain connected to node D and its gate connected to node A to receive complementary ECL level input signal Din.

Reference circuitry 110 includes N-channel bias transistors MN1 and MN2 and a current divider comprising P-channel transistor MP3 and N-channel transistor MN3. More specifically, transistor MN1 has its drain connected to node B (i.e. to the drain of transistor MP1), its source connected to the lower rail and its gate connected to node E. Transistor MN2 has its drain connected to node D (i.e. to the drain of transistor MP2), its source connected to the lower rail and its gate connected to node E.

Node E serves as the point of connection between the current divider transistors MN3 and MP3. Transistor MN3 has both its drain and its gate connected to node E; its source is connected to the lower rail. Transistor MP3 has its source connected to the positive supply, its drain connected to node E and its gate connected to the lower rail.

The gain stage 106 includes two N-channel gain stage input transistors MN4 and MN5, a current mirror comprising P-channel transistors MP4 and MP5, and current source transistor MN6. Transistor MN4 has its source connected to node F, its drain connected to node H and its gate connected to node B to receive intermediate CMOS level signal Dint from the translator stage 102. Transistor MN5 has its source connected to node F, its drain connected to node G and its gate connected to node D to receive complementary CMOS level signal [Dint] from the translator stage 102. Transistor MP4 has its source connected to the positive supply, its drain connected to node H and its gate connected to node G. Transistor MP5 has its source connected to the positive supply and both its drain and its gate connected to node G. Transistor MN6 has its drain connected to node F, its source connected to the lower rail and its gate connected to the positive supply.

FIG. 4 also shows an optional buffer 112 which can be added on the output to drive additional load.

In a first scenario describing the operation of the FIG. 4 circuit 100, assume that the differential ECL input signals received at nodes A and C swing to $(-\Phi e)$, i.e., logic "1", and $(-\Phi e - 1700 \text{ mV})$, i.e., logic "0", or CMOS values of Din=4.33 V and [Din]=2.63 V, respectively. Input transistors MP1 and MP2 operate at a reference Vee= $-5.2$, and where $\Phi e = -0.9$.

In this scenario, with transistor MP1 having a Vgs= $-1.7$ V, Vt typically being $-1.0$, transistor MP1 is on. The Vgs of transistor MP2 being equal to $+1.7$, transistor MP2 is off. Therefore, transistor MP1 being on starts to pull up node B. Transistor MP2 being off, node (D) is pulled down by transistor MN2.

Because node B is now high and node D is low, transistor MN4 turns on and transistor MN5 turns off. With transistor MN5 off, transistor MP5 charges node G to the supply voltage Vcc-Vtp and cuts off transistor MP4.

Charging node B up turns transistor MN4 further on, pulling down the output node H to the full CMOS Vss (ground) level.

Turning now to the operation of the reference circuitry 110, transistors MP3 and MN3 form a current divider that is always on. Reference transistors MP3 and MN3 track the Vt of the P-channel and N-channel devices, respectively, in the remainder of the circuit 100. Thus, as the P-channel transistors of the circuit 100 get stronger due to process variations, transistor MP3 biases transistors MN1 and MN2 stronger. Conversely, as N-channel transistors of the circuit 100 get stronger due to process variations, diode-connected transistor MN3 pulls down node E, which is connected to the gates of transistors MN1 and MN2.

Thus, the reference current divider circuit 110 compensates for P- and N-channel process variations by maintaining the trip point of the translator stage 102 at a constant level. Furthermore, because it is supplied by a current divider, the bias voltage of transistors MN1 and MN2 doesn't change substantially with temperature.

If the polarity of the ECL level input signals Din and [Din] is reverted, the Vgs of transistor MP1 = 1.7 V and transistor MP1 is off. Conversely, the Vgs of transistor MP2 = −1.7 V and transistor MP2 is on.

However, in switching the inputs Din and [Din] from one level to the other, a cross-over point is reached where transistor MP1 and transistor MP2 are both off. This cuts down the power even lower than the standby state, unlike conventional CMOS circuits. As the inputs Din and [Din] continue to switch, the reference current divider circuit 110 pulls node B down.

Since transistor MP2 is on, node D goes up, turning transistor MN5 on while transistor MN4 is off. In this condition, node G is pulled down, which begins to turn transistor MP4 on. Then transistor MP4 pulls up node H to the full CMOS Vcc level.

It should be understood that various alternatives to the embodiment of the invention described herein may be employed in practicing the invention. It is intended that the following claims define the scope of the invention and that methods and apparatus within the scope of these claims and their equivalents be covered thereby.

What is claimed is:

1. A differential ECL-to-CMOS translator circuit utilizable for translating ECL level signals to CMOS level signals, the translator circuit comprising:
   (a) a translator stage that converts differential ECL level input signals to differential intermediate CMOS level signals;
   (b) a gain stage that converts the differential intermediate CMOS level signals to full CMOS level output signals; and
   (c) temperature independent reference circuitry responsive to the differential intermediate CMOS level signals for maintaining a trip point of the translator stage at a constant level.

2. A translator circuit as in claim 1 wherein the translator stage comprises first and second switching means responsive to respective ones of the differential ECL level input signals such that, in switching the differential inputs from one ECL level to another, a cross-over point is reached wherein the first and second switching means are both off whereby the power consumed by the translator circuit is lower than in the standby state.

3. A translator circuit as in claim 1 wherein the temperature independent reference circuitry comprises:
   (a) a first bias switch connected between a first of the differential intermediate CMOS level signals and ground;
   (b) a second bias switch connected between the second differential intermediate CMOS level signal and ground;
   (c) a bias node connected between the first and second bias switches; and
   (d) a current divider that tracks a characteristic of the translator circuit and controls the bias voltage at the bias node.

4. A differential ECL-to-CMOS translator circuit utilizable for translating differential ECL level signals received at first and second input nodes, respectively, to CMOS level signals, the translator circuit comprising:
   (a) a translator stage (102) that includes
      (i) a first P-channel input transistor (MP1) having its source connected to the first input node (A), its drain connected to a first intermediate node (B), and its gate connected to the second input node (C); and
      (ii) a second P-channel input transistor (MP2) having its source connected to the second input node (C), its drain connected to a second intermediate node (D), and its gate connected to the first input node (A);
   (b) a gain stage (106) that includes
      (i) a first N-channel gain stage input transistor (MN4) having its gate connected to the first intermediate node (B) and its drain connected to an output node (H);
      (ii) a second N-channel gain stage input transistor (MN5) having its gate connected to the second intermediate node (D);
      (iii) a current mirror comprising a first P-channel mirror transistor (MP4) having its source connected to a positive supply and its drain connected to the output node (H) and a second P-channel mirror transistor (MP5) having its gate connected to the gate of the first mirror transistor (MP4) and to the drain of the first gain stage input transistor (MN5), its source connected to the positive supply, and wherein first mirror transistor (MP4) has its drain connected to the drain of the first gain stage input transistor (MN4); and
      (iv) a N-channel current source transistor (MN6) having its drain connected to the sources of both the first and second gain stage input transistors (MN4, MN5), its source connected to a negative supply, and its gate connected to the positive supply; and
   (c) a reference current divider circuit (110) that includes
      (i) a bias node (E);
      (ii) a first N-channel bias transistor (MN1) having its source connected to the negative supply, it drain connected to the first intermediate node (B), and its gate connected to the bias node (E);
      (iii) a second N-channel bias transistor (MN2) having it source connected to the negative supply, its drain connected to the second intermediate node (D), and its gate connected to the bias node (E);
      (iv) a P-channel current divider transistor (MP3) having its source connected to the positive supply, its gate connected to the negative supply, and its drain connected to the bias node (E); and
      (v) a N-channel current divider transistor (MN3) having its source connected to the negative supply, its gate connected to the bias node, and its drain connected to the bias node (E).

5. A translator circuit as in claim 4 and further including a buffer connected to the output node (H) for driving an additional load.

* * * * *